United States Patent
Kinsey et al.

(10) Patent No.: US 7,326,970 B2
(45) Date of Patent: Feb. 5, 2008

(54) METAMORPHIC AVALANCHE PHOTODETECTOR

(75) Inventors: Geoffrey S. Kinsey, Pasadena, CA (US); Dmitri D. Krut, Encino, CA (US); Joseph C. Boisvert, Thousand Oaks, CA (US); Christopher M. Fetzer, Saugus, CA (US); Richard R. King, Thousand Oaks, CA (US)

(73) Assignee: The Boeing Company, Chicago, IL (US)

( * ) Notice: Subject to any disclaimer, the term of this patent is extended or adjusted under 35 U.S.C. 154(b) by 62 days.

(21) Appl. No.: 11/077,899

(22) Filed: Mar. 11, 2005

(65) Prior Publication Data

US 2006/0202243 A1     Sep. 14, 2006

(51) Int. Cl.
*H01L 31/109* (2006.01)
(52) U.S. Cl. .................................. 257/186; 257/438
(58) Field of Classification Search ............... 257/186, 257/438
See application file for complete search history.

(56) References Cited

U.S. PATENT DOCUMENTS

| | | | |
|---|---|---|---|
| 6,558,973 B2 | 5/2003 | Johnson et al. | |
| 6,697,412 B2 | 2/2004 | Beam, III et al. | |
| 6,894,322 B2* | 5/2005 | Kwan et al. | 257/186 |
| 2003/0047752 A1* | 3/2003 | Campbell et al. | 257/186 |
| 2004/0065363 A1 | 4/2004 | Fetzer et al. | |
| 2004/0079408 A1 | 4/2004 | Fetzer et al. | |
| 2005/0072460 A1* | 4/2005 | Uppal | 136/253 |
| 2005/0274411 A1* | 12/2005 | King et al. | 136/256 |
| 2006/0001118 A1* | 1/2006 | Boisvert et al. | 257/438 |
| 2006/0121683 A1* | 6/2006 | Francis et al. | 438/380 |

OTHER PUBLICATIONS

Jang, J.H., Cueva, G., Sankaralingam, R., Fay, P., Hoke, W.E., and Adesida, I., Fellow, IEEE; Wavelength Dependent Characteristics of High-Speed Metamorphic Photodiodes; IEEE Photonics Technology Letters; Feb. 2003; pp. 281-283; vol. 15; issue No. 2.
Kinsey, G.S., Gotthold, D.W., Holmes, Jr., A.L., Campbell, J.C.; GaNAs resonant-cavity photodiode operating at 1.064 µm; Applied Physics Letters; Sep. 4, 2000; pp. 1543-1544; vol. 77; issue No. 10.

* cited by examiner

*Primary Examiner*—Long Pham
(74) *Attorney, Agent, or Firm*—McNees Wallace & Nurick, LLC

(57) ABSTRACT

A metamorphic avalanche photodetector includes a substrate, and an active structure supported on the substrate. The active structure has a metamorphic absorption structure that absorbs light and responsively produces primary charge carriers, and an avalanche multiplication structure that receives the primary charge carriers from the metamorphic absorption structure and responsively produces secondary charge carriers. An output electrical contact is in electrical communication with the active structure to collect at least some of the secondary charge carriers. A buffer layer lies between the substrate and the active structure, between the active structure and the output electrical contact, or between the metamorphic absorption structure and the avalanche multiplication structure. A lattice parameter of the buffer layer varies with position through a thickness of the buffer layer.

8 Claims, 3 Drawing Sheets

METAMORPHIC AVALANCHE PHOTODETECTOR

This invention relates to an avalanche photodetector and, more specifically, to a metamorphic avalanche photodetector that may be tailored to be responsive to specific wavelengths of light.

BACKGROUND OF THE INVENTION

A photodetector receives light as an input signal and produces an electrical voltage or current whose magnitude is proportional to the intensity of the light. A wide variety of imaging and non-imaging photodetectors, operating by various principles, are known. Some photodetectors are sensitive to a wavelength band, while others are sensitive to specific wavelengths. The photodetector may include integral amplification of the output electrical signal, a particularly useful feature where the light intensity of interest is small.

One type of integrated detector and amplifier is an avalanche photodetector. In the avalanche photodetector, a semiconductor absorber produces primary charge carriers (i.e., electrons and/or holes) responsive to the input light signal, and an integral avalanche multiplication region produces a larger number of secondary charge carriers generated by the primary charge carriers.

The effective absorption wavelength range of the semiconductor absorber is a function of the bandgap of its semiconductor material. Currently, there are operable semiconductor materials for some light wavelengths and not for others. For example, the widely used Nd:YAG laser produces light at 1.064 micrometers wavelength. This wavelength falls at or above the long-wavelength limit of infrared-enhanced silicon photodetectors. Due to the indirect bandgap of silicon, silicon photodetectors must have thick active regions in order to reach even modest efficiencies. The thick active region limits the maximum speed of operation of the photodetector. GaInAs material, on the other hand, that is tuned to this wavelength, is not lattice matched to available substrates, resulting in low material quality and poor device performance. GaInAs photodetectors lattice matched to available substrates suffer from excessive thermal currents that degrade performance. Proposed solutions such as the use of ultrathin layers and the use of exotic materials such as GaNAs are complex and expensive. As a result, high-sensitivity, high-speed avalanche photodetectors for light at the 1.064 micrometer wavelength are not practical. There are other wavelengths as well for which avalanche photodetectors are not available.

There is a need for a design approach that allows for the fabrication of an effective avalanche photodetector for specific wavelengths of light, such as 1.064 micrometers wavelength. The approach must provide for an effective light absorber for the selected wavelength, and also for good semiconductor quality to achieve good effectiveness of the conversion of light energy to electrical energy. The present invention fulfills this need, and further provides related advantages.

SUMMARY OF THE INVENTION

The present invention provides an avalanche photodetector that permits the use of photoconversion absorption layers that are effective at a selected wavelength, but are otherwise not lattice-matched to available substrates. The photodetector is low noise and high performance. The present approach also allows the absorber layer to be made thin and with a consequent fast response time, so that the photodetector is capable of high speed operation. The absorber may be lattice matched to its avalanche multiplication structure.

A metamorphic avalanche photodetector comprises a substrate and an active structure supported on the substrate. The active structure comprises a metamorphic absorption structure that absorbs light and responsively produces primary charge carriers, and an avalanche multiplication structure that receives the primary charge carriers from the metamorphic absorption structure and responsively produces secondary charge carriers. ("Charge carriers" may include electrons and/or holes.) An output electrical contact is in electrical communication with the active structure to collect at least some of the secondary charge carriers. A buffer layer lies between the substrate and the active structure, between the active structure and the output electrical contact, and/or between the metamorphic absorption structure and the avalanche multiplication structure. A lattice parameter of the buffer layer varies with position through a thickness of the buffer layer.

A key to this approach is the utilization of the buffer layer to sequester strain-related defects away from the active semiconductor structure. The metamorphic absorption structure has a lattice parameter that is selected to optimize its absorption of light wavelengths of interest and the resulting production of primary charge carriers. The lattice parameter typically differs sufficiently from the adjacent layers that a high differential strain results between the metamorphic absorption structure and the adjacent layers. Absent the buffer layer, this high differential strain leads to the production of mismatch dislocations in the active layer, greatly reducing the device performance. In the present approach, the buffer layer provides a gradual transition between the lattice parameter of the adjacent layer and the lattice parameter of the metamorphic absorption structure. The incidence and magnitude of strain-related defects such as locally concentrated elastic strains and mismatch dislocations are significantly reduced. The mismatch dislocations are preferentially held in the buffer layer and trapped away from the active structure. The buffer layer may have a stepwise composition variation or a continuously graded composition variation with increasing distance through its thickness.

In one embodiment, the metamorphic absorption structure preferably comprises a buffer layer contacting the substrate. The buffer layer has a buffer layer composition that changes with increasing distance from the substrate. An absorption layer contacts the buffer layer. The absorption layer absorbs the light and responsively produces the primary charge carriers. In an application of particular interest, the substrate is transparent to light of a wavelength of 1.064 micrometers, and the metamorphic absorption structure absorbs light of a wavelength of 1.064 micrometers. In an implementation, the substrate is p+ gallium arsenide, and the metamorphic absorption structure includes gallium indium arsenide, which is a modification of gallium arsenide wherein indium has replaced a portion of the gallium, producing a composition of $Ga_{0.77}In_{0.23}As$, a composition termed "23 percent indium". Gallium indium arsenide of this composition is not naturally lattice matched to gallium arsenide. Instead, the buffer layer effects a strain transition of the gallium indium arsenide absorption layer to the gallium arsenide substrate.

The avalanche multiplication structure preferably comprises an optional charge layer contacting the metamorphic absorption structure, and a multiplication layer contacting the charge layer. The multiplication layer receives the primary charge carriers from the metamorphic absorption structure and responsively produces the secondary charge carriers. The charge layer acts to keep the electric field in the multiplication layer high, while keeping the electric field in the absorption layer low. An electrical bias source preferably applies a bias voltage across the active structure. The multiplication layer may, for example, have a composition within the aluminum-gallium-indium-arsenic phase diagram. Such compositions may include, for example, aluminum gallium indium arsenide, aluminum gallium arsenide, or aluminum indium arsenide. These materials provide low-noise operation.

In another embodiment with a partially inverted structure, the avalanche multiplier structure is deposited upon the substrate, the buffer layer is deposited upon the avalanche multiplier structure, and the absorption layer is deposited upon the avalanche multiplier structure.

The present approach provides an avalanche photodetector that may be structured to achieve photodetection of specific wavelengths, by selecting the appropriate metamorphic absorption layer. The use of a buffer layer allows for the metamorphic absorption layer of different lattice parameter than the substrate or the avalanche amplification structure. Buffer layers are used between the layers of different lattice parameters, so that the primary charge carrier flow from the metamorphic absorption structure to the avalanche multiplication structure is not impeded.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
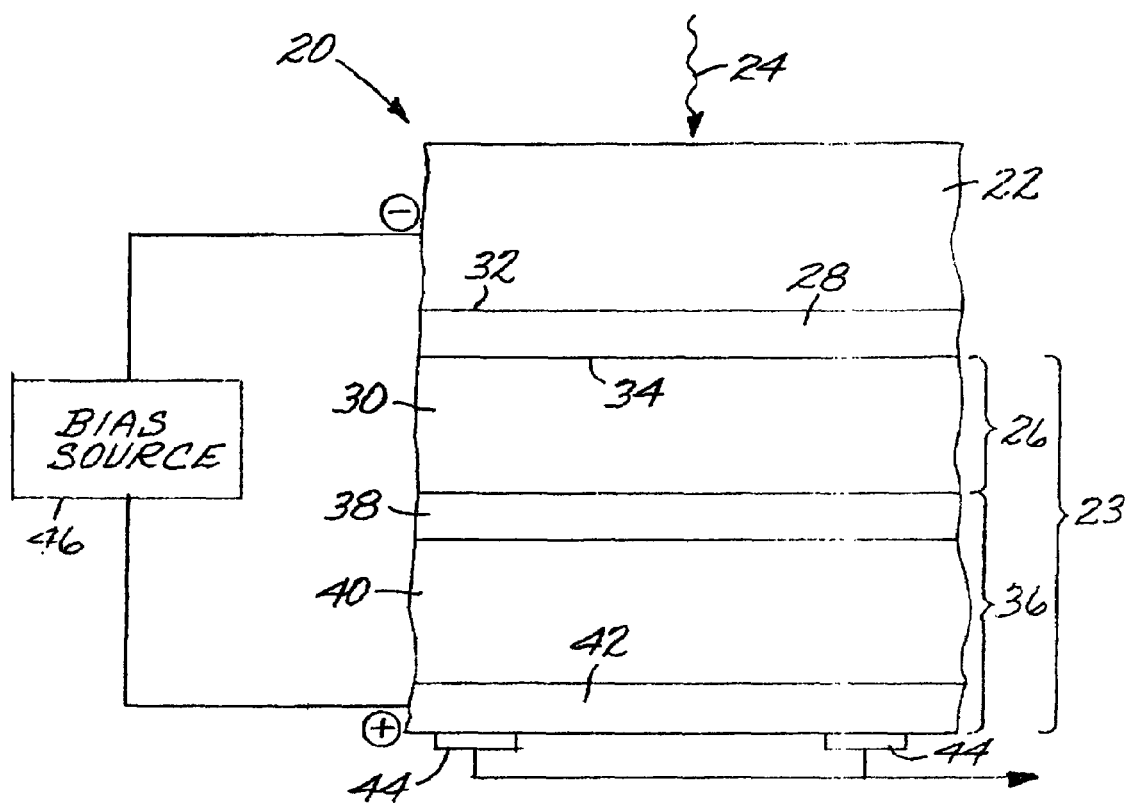
FIG. 1 is a schematic elevational view of a first embodiment of a metamorphic avalanche photodetector.

FIG. 1 depicts an embodiment of the structure of the invention in the form of a metamorphic avalanche photodetector 20. (Like the other drawings, FIG. 1 is not to scale.) The metamorphic avalanche photodetector 20 includes a substrate 22, and an active structure 23 supported on (but not contacting) the substrate 22. When the metamorphic avalanche photodetector 20 is in service, light 24 enters the metamorphic avalanche photodetector 20 through the substrate 22, which is transparent to the light 24, to reach the active structure 23.

In the embodiment of FIG. 1, the active structure 23 includes a buffer layer 28 that is deposited epitaxially upon and contacts the substrate 22. The buffer layer 28 has a buffer layer composition that changes with increasing distance from the substrate 22. The buffer layer 28 is transparent to the light 24.

A metamorphic absorption structure 26, which is part of the active structure 23, is epitaxially deposited upon the buffer layer 28. The metamorphic absorption structure 26 includes an absorption layer 30 that absorbs light and produces primary charge carriers in response. "Charge carriers" as used herein may include electrons and/or holes. "Metamorphic" as used herein denotes the presence of a layer whose lattice parameter is so different from that of another layer, in this case the substrate 22, that strain dislocations occur at an interface therebetween, absent the presence of the buffer layer 28.

The absorption layer 30 is deposited epitaxially upon and contacts the buffer layer 28. The composition of the absorption layer 30 is selected so that the absorption layer 30 absorbs the light 24 and responsively produces the primary charge carriers. In the general case, the absorption layer 30 could not be epitaxially deposited directly upon the substrate 22. If an attempt were made to deposit the absorption layer 30 directly upon the substrate 22, there would be a high dislocation density at the interface that would interfere with the functionality of the absorption layer 30.

Figure 2:
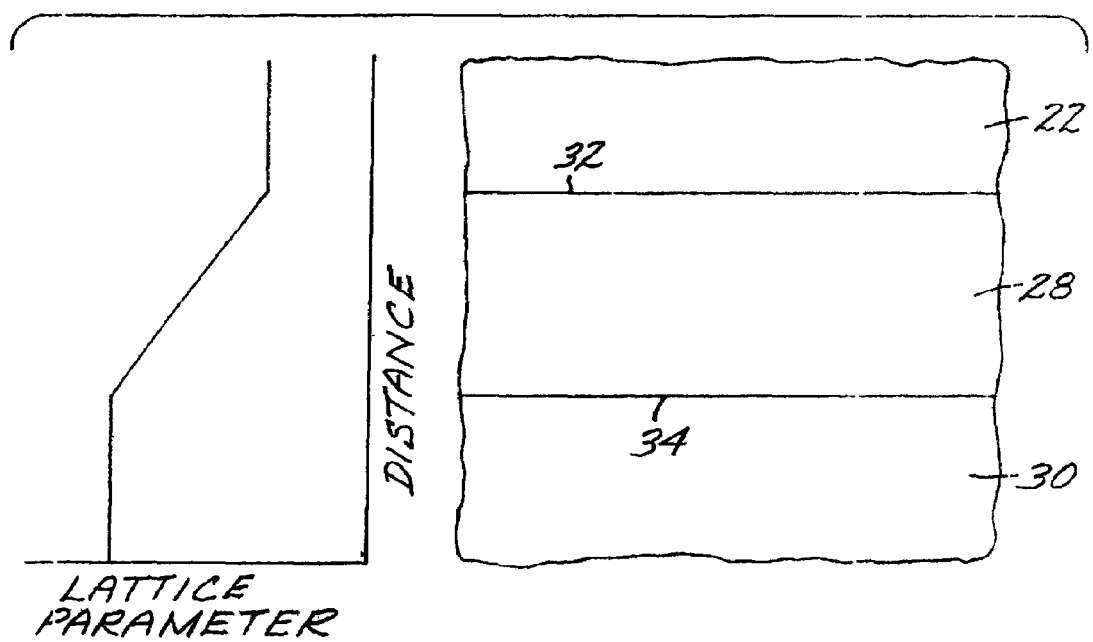
FIG. 2 is a schematic sectional view of a detail of the first embodiment of the metamorphic avalanche photodetector, with a graph indicating a first approach for the change of lattice parameter with thickness.
Figure 3:
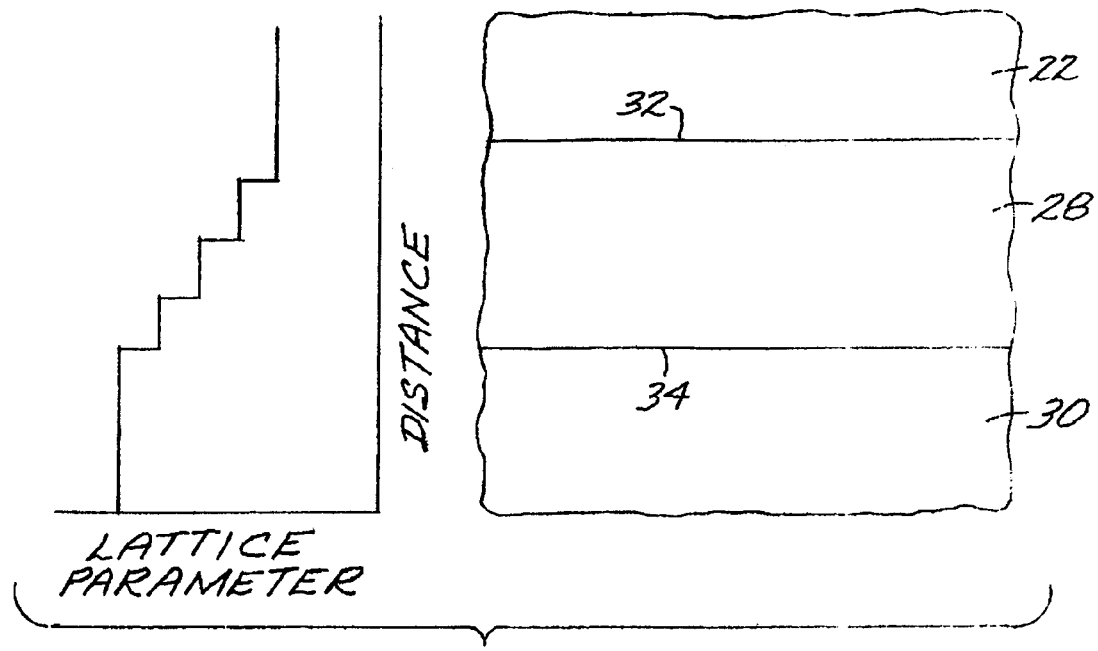
FIG. 3 is a schematic sectional view of a detail of the first embodiment of the metamorphic avalanche photodetector, with a graph indicating a second approach for the change of lattice parameter with thickness.

Instead, the buffer layer 28 is present to facilitate the lattice-parameter transition between the substrate 22 and the absorption layer 30. The composition of the buffer layer 28 is selected so that the buffer layer 28 may be epitaxially deposited upon the substrate 22, but then the composition is changed with increasing distance from the substrate 22 so that the absorption layer 30 may be epitaxially deposited upon the buffer layer 28. (The lattice parameters of the substrate 22, the buffer layer 28, and the absorption layer 30 are dependent upon their respective local compositions.) The composition change in the buffer layer 28 may be accomplished by a continuously graded change in composition with increasing distance through the thickness of the buffer layer 28, which in this case may be measured as the distance from the substrate 22, as illustrated in FIG. 2. The composition change in the buffer layer may instead be accomplished by one or more stepwise changes in composition with increasing distance from the substrate 22, as illustrated in FIG. 3. The composition change may be accomplished by a combination of the continuous and stepwise changes. The thickness of the buffer layer 28 is selected to be whatever is required to accomplish the required composition change between the composition that is epitaxial with the substrate 22 and the composition that is epitaxial with the absorption layer 30.

Referring again to FIG. 1, an avalanche multiplication structure 36, which is part of the active structure 23, is deposited epitaxially upon the metamorphic absorption structure 26. The avalanche multiplication structure 36 receives the primary charge carriers from the metamorphic absorption structure 26 and responsively produces secondary charge carriers. The avalanche multiplication structure 36 may be of any operable type.

Preferably and as illustrated, the avalanche multiplication structure 36 is of the Separate Absorption Charge Multiplication (SACM) type. The avalanche multiplication structure 36 preferably comprises an optional charge layer 38 that is epitaxially deposited upon and contacts the metamorphic absorption structure 26, and specifically the absorption layer 30. A multiplication layer 40 is epitaxially deposited upon and contacts the charge layer 38. The multiplication layer 40 receives the primary charge carriers from the metamorphic absorption structure 26 and responsively produces the secondary charge carriers. A contact layer 42 is epitaxially deposited upon and contacts the multiplication layer 40. The contact layer 42 provides a good ohmic contact. The contact layer 42 may be chosen to have a lattice parameter that achieves a strain balance for the entire structure. In service, a high electrical field is applied across the multiplication layer 40, and it must therefore have a low defect density as associated with good lattice matching to the metamorphic absorption structure 26.

An output electrical contact layer 44 is in electrical communication with the avalanche multiplication structure 36, preferably through its contact layer 42, to collect at least some of the secondary charge carriers that are produced by the multiplication layer 40.

An electrical bias source 46 applies a bias voltage between the metamorphic absorption structure 26, and specifically the absorption layer 30, and the multiplication layer 40. Where the primary charge carriers are electrons, the absorption layer 30 is biased negative relative to the multiplication layer 40 so that there is an applied electrical field which causes the primary charge carrier electrons generated by the absorption of light in the absorption layer 30 to move toward and into the multiplication layer 40. An appropriate bias is provided where the primary charge carriers are holes.

In a preferred embodiment designed to detect light having a wavelength of 1.064 micrometers, the substrate 22 is p+ gallium arsenide having a [100] crystallographic orientation and a thickness that is typically about 600 micrometers. The buffer layer 28 is also doped p+ and has a composition that is gallium arsenide at a buffer/substrate interface 32 in contact with the substrate 22, and has increasing amounts of indium with increasing distance from the substrate 22. The increasing amount of indium is accomplished in either a stepwise or continuously graded fashion. The composition of the buffer layer 28 reaches that of the metamorphic absorption layer 26 at an absorption layer/buffer interface 34.

The preferred absorption layer 30 has a composition of about $Ga_{0.77}In_{0.23}As$, a composition range that efficiently absorbs the light having the wavelength of 1.064 micrometers. The substrate 22 and the buffer layer 28 are transparent to and do not absorb this wavelength of light, because their compositions are significantly different from $Ga_{0.77}In_{0.23}As$. The absorption layer 30 is preferably made as thin as possible consistent with the requirement to absorb the light of 1.064 micrometer wavelength and produce primary charge carriers. The thinner the absorption layer 30, the faster is its response time and the faster the operation of the metamorphic avalanche photodetector 20. In a typical case, the absorption layer 30 is from about 0.5 to about 2 micrometers thick.

In this preferred embodiment, the charge layer 38 is n-type aluminum gallium indium arsenide, typically about 0.2 micrometers thick. The charge layer 38 keeps the electric field low in the absorption layer 30 and high in the multiplication layer 40.

The multiplication layer 40 preferably has a composition within the aluminum-gallium-indium-arsenic phase diagram. That is, the multiplication layer 40 is a binary, ternary, or quaternary composition selected from the elements aluminum, gallium, indium, and arsenic. Particularly preferred compositions include aluminum gallium arsenide, which is nearly lattice matched to germanium and to gallium arsenide and is an excellent producer of low-noise avalanche multiplication of the primary charge carriers to form large numbers of secondary charge carriers. Aluminum indium arsenide and aluminum gallium indium arsenide are also good choices, the latter providing reduced strain with respect to the absorption layer 30. The multiplication layer 40 preferably has a thickness of from about 0.2 micrometers to about 0.6 micrometers.

In this preferred embodiment, the electrical bias source 46 preferably applies a voltage of about 30 volts across the active structure 23.

Figure 4:
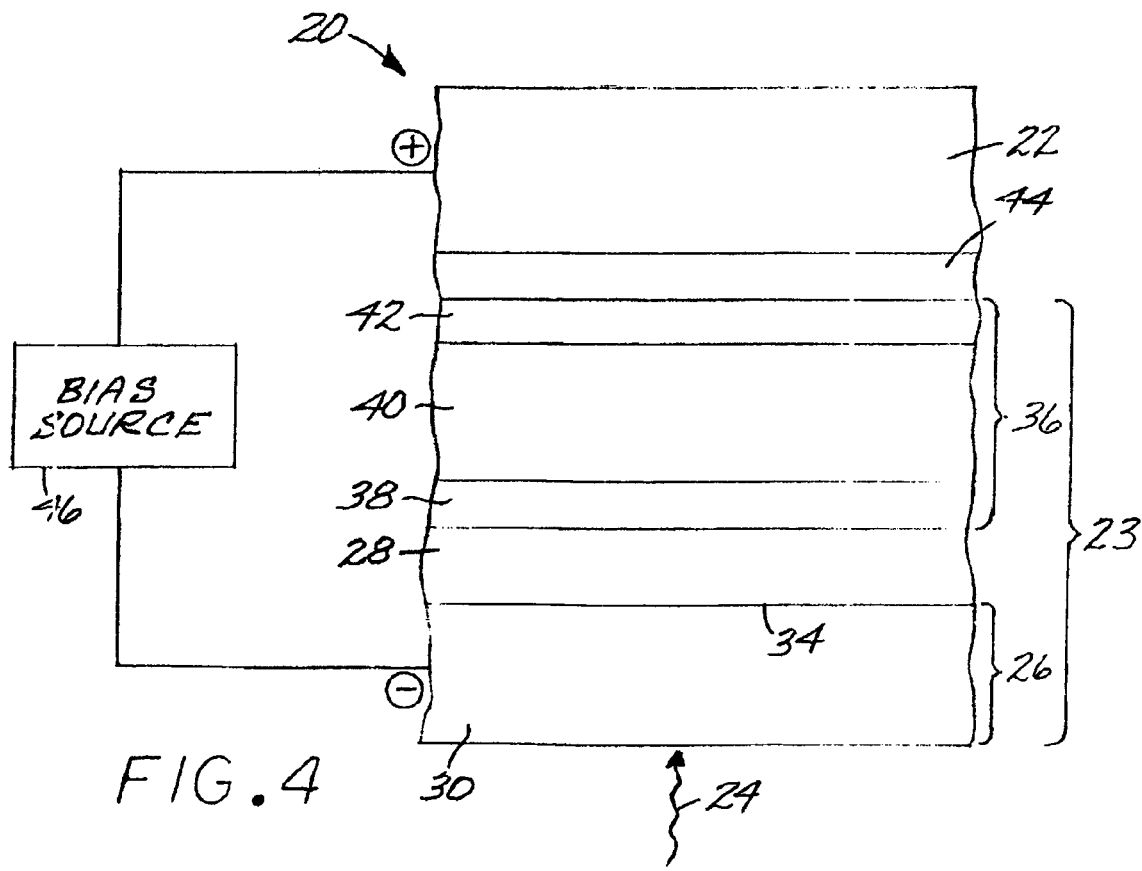
FIG. 4 is a schematic elevational view of a second embodiment of a metamorphic avalanche photodetector.

Another, but less preferred, embodiment is illustrated in FIG. 4. In this case, the light 24 is not directed through the substrate 22. The various elements of structure are the same as in the embodiment of FIG. 1, and the discussion is incorporated here, but the order of the elements of structure is changed. The output electrical contact layer 44 is deposited onto the substrate, the avalanche multiplication structure 36 is deposited upon the output electrical contact layer 44, the buffer layer 28 is deposited upon the avalanche multiplication structure 36, and the metamorphic absorption structure is deposited upon the buffer layer 28. The components of the active structure 23, including the metamorphic absorption structure 26 and the avalanche multiplication structure 36, are separated by the buffer layer 28. The defect segregation achieved by the buffer layer 28 therefore reduces mismatch defect density in the components of the active structure 23, but the mismatch defects are sandwiched within the active structure 23. As a result, this embodiment is less preferred than that of FIG. 1.

Figure 5:
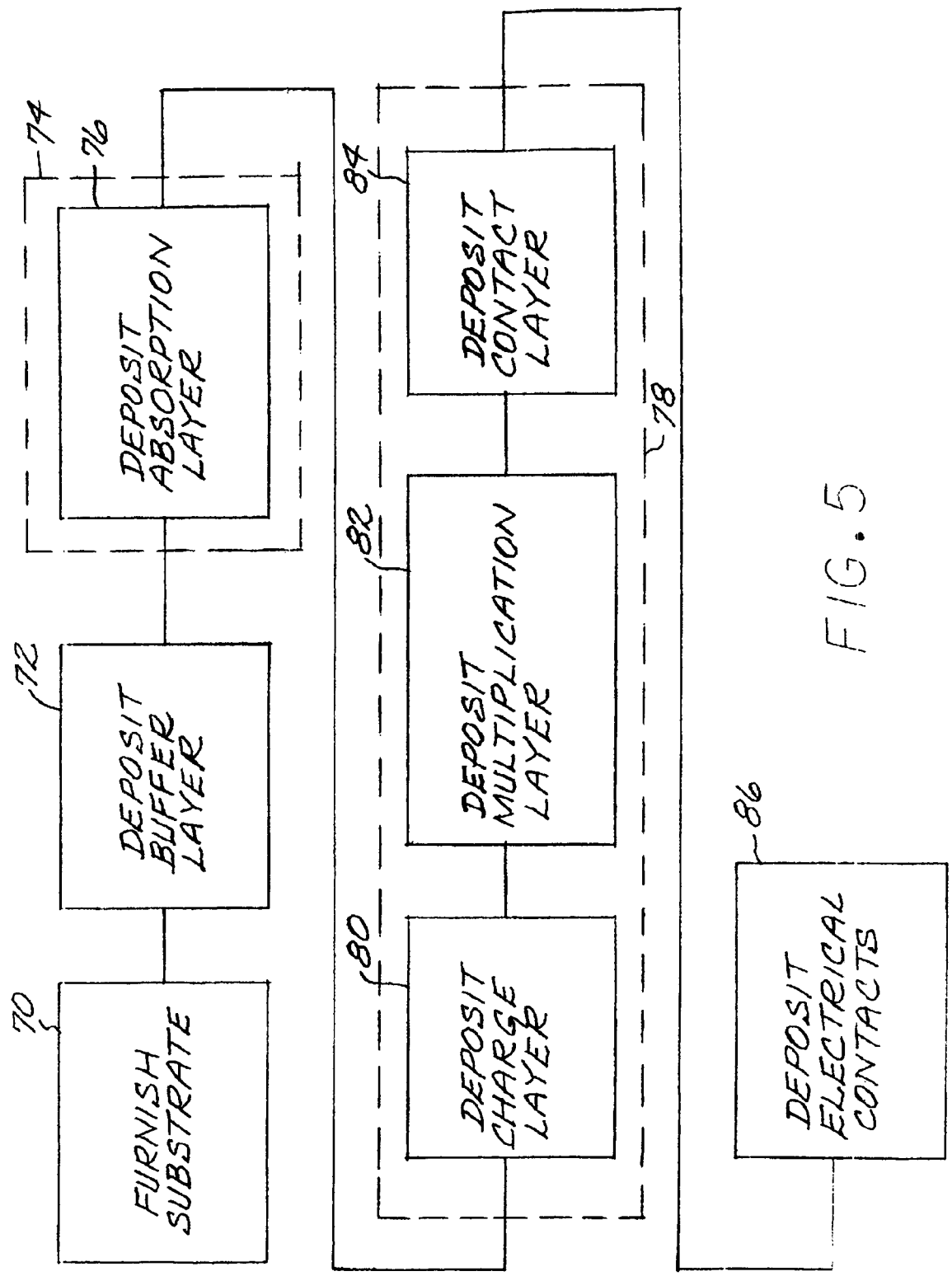
FIG. 5 is a block flow diagram of an approach for fabricating the first embodiment of the metamorphic avalanche photodetector.

FIG. 5 depicts a method for fabricating the metamorphic avalanche photodetector 20 of FIG. 1, the preferred embodiment. The substrate 22 is furnished, step 70. The buffer layer 28 is deposited upon the substrate 22, step 72. The metamorphic absorption structure 26 is deposited upon the substrate 22, step 74. To perform step 74, the absorption layer 30 is deposited upon the buffer layer 28, step 76. Next, the avalanche multiplication structure 36 is deposited upon the metamorphic absorption structure 26, step 78. In performing step 78, the charge layer 38 is deposited upon the absorption layer 30, step 80, the multiplication layer 40 is deposited upon the charge layer 38, step 82, and the contact layer 84 is deposited upon the multiplication layer 82, step 84. Finally, the electrical contact layers 44 and the contacts for the bias source 46 are deposited, step 86. The deposition is preferably accomplished by epitaxial growth. The various deposition steps may each be performed by any operable approach, such as metal organic vapor phase epitaxy (MOVPE) or molecular beam epitaxy (MBE). To fabricate the embodiment illustrated in FIG. 4, similar steps are performed, except that the order of the steps is changed in accordance with the prior description of the structure of FIG. 4.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A metamorphic avalanche photodetector, comprising:
a substrate;
a buffer layer contacting the substrate, wherein the buffer layer has a buffer layer composition that changes with increasing distance from the substrate;
an active structure deposited upon the buffer layer, wherein the active structure comprises
a metamorphic absorption structure that absorbs light and responsively produces primary charge carriers, and an avalanche multiplication structure that receives the primary charge carriers from the metamorphic absorption structure and responsively produces secondary charge carriers, and wherein the avalanche multiplication structure comprises
- a charge layer contacting the metamorphic absorption structure,
- a multiplication layer contacting the charge layer, wherein the multiplication layer receives the primary charge carriers from the metamorphic absorption structure and responsively produces the secondary charge carriers, and
- a contact layer contacting the multiplication layer; and an output electrical contact in electrical communication with the active structure to collect at least some of the secondary charge carriers.

2. The metamorphic avalanche photodetector of claim 1, wherein the buffer layer is deposited upon the substrate, the metamorphic absorption structure is deposited upon the buffer layer, and the avalanche multiplication structure is deposited upon the metamorphic absorption structure.

3. The metamorphic avalanche photodetector of claim 1, further including
an electrical bias source that applies a bias voltage across the active structure.

4. The metamorphic avalanche photodetector of claim 1, wherein the substrate is transparent to light of a wavelength of 1.064 micrometers, and the metamorphic absorption structure absorbs light of a wavelength of 1.064 micrometers.

5. The metamorphic avalanche photodetector of claim 1, wherein the substrate is gallium arsenide, and the metamorphic absorption structure is $Ga_{0.77}In_{0.23}As$.

6. A metamorphic avalanche photodetector, comprising:
a p+ gallium arsenide substrate,
a buffer layer contacting the substrate, wherein the buffer layer has a buffer layer composition that changes with increasing distance from the substrate,
an active structure deposited upon the buffer layer, wherein the active structure comprises
- a metamorphic absorption layer deposited upon the buffer layer, wherein the metamorphic absorption layer absorbs light and responsively produces primary charge carriers, and wherein the absorption layer has a composition of $Ga_{0.77}In_{0.23}As$;
- an avalanche multiplication structure deposited upon the metamorphic absorption structure, wherein the avalanche multiplication structure receives the primary charge carriers from the metamorphic absorption structure and responsively produces secondary charge carriers, and wherein the avalanche multiplication structure comprises
  - a charge layer contacting the metamorphic absorption structure,
  - a multiplication layer contacting the charge layer, wherein the multiplication layer receives the primary charge carriers from the metamorphic absorption structure and responsively produces the secondary charge carriers, and wherein the multiplication layer has a composition within the aluminum-gallium-indium-arsenic phase diagram, and
  - a contact layer contacting the multiplication layer;
an electrical bias source that applies a bias voltage across the active structure; and
an output electrical contact in electrical communication with the avalanche multiplication structure to collect at least some of the secondary charge carriers.

7. The metamorphic avalanche photodetector of claim 6, wherein the buffer layer has a stepwise composition variation with increasing distance from the substrate.

8. The metamorphic avalanche photodetector of claim 6, wherein the buffer layer has a continuous composition variation with increasing distance from the substrate.

* * * * *